United States Patent [19]

Huber et al.

[11] Patent Number: 4,521,913
[45] Date of Patent: Jun. 4, 1985

[54] MULTIFREQUENCY ANTENNA MATCHING APPARATUS WITH AUTOMATIC TUNING

[75] Inventors: Franz R. Huber, Assling; Axel Stark, Munich, both of Fed. Rep. of Germany

[73] Assignee: Rohde & Schwarz GmbH & Co., KG, Munich, Fed. Rep. of Germany

[21] Appl. No.: 396,715

[22] Filed: Jul. 9, 1982

[30] Foreign Application Priority Data

Jul. 11, 1981 [DE] Fed. Rep. of Germany ....... 3127566

[51] Int. Cl.³ .............................................. H04B 1/02
[52] U.S. Cl. ................................... 455/121; 455/125; 455/129
[58] Field of Search ...................... 343/861, 858, 876; 455/107, 121, 123, 129, 103, 125

[56] References Cited

U.S. PATENT DOCUMENTS 3,277,377 10/1966 Guyton et al. ...................... 455/121
3,883,875 5/1975 McClymont et al. ............... 343/876
4,143,369 3/1979 Ayers ................................... 343/876

OTHER PUBLICATIONS

"Programmable Antenna-Tuning Unit and its Use with Shortwave Transmitter SK1/39 . . . " printed in *News of Rohde & Schwarz*, Dec. 1970.

Primary Examiner—Eli Lieberman
Assistant Examiner—K. Ohralik
Attorney, Agent, or Firm—Willian, Brinks, Olds, Hofer, Gilson & Lione Ltd.

[57] ABSTRACT

An antenna matching apparatus tunable to different frequencies is disclosed for use with a high frequency transmitter that is rapidly switchable between different transmitting frequencies by a control unit according to a predetermined frequency scheme. This apparatus which is tunable as quickly as the transmitter, includes two or more antenna tuning means tuned to different frequencies which are tuned to different frequencies and switched rapidly by the control unit.

4 Claims, 1 Drawing Figure

MULTIFREQUENCY ANTENNA MATCHING APPARATUS WITH AUTOMATIC TUNING

BACKGROUND OF THE INVENTION

This invention relates to an antenna matching apparatus for a high-frequency transmitter which is speedily switchable between different transmitter frequencies according to a predetermined frequency scheme.

Radio transmission processes will often involve very rapid frequency changes by the transmitter. Frequency changing is a known practice for avoiding interferences in radio transmission. According to this practice, the transmitter is abruptly switched according to a frequency scheme which is a sequence of frequencies. The scheme used is the same as the scheme known and used by the receiver. Depending upon the value of the frequency band, the switching times that are possible with modern transmitters are on the order of milliseconds or even microseconds. The present invention strives for even shorter switching times.

The impedance of antennas operated with such frequency changing transmitters must be matched in their impedance with the output resistance of the transmitter. This is especially true for antennas that are small relative to the wave length and for those antennas used in mobile applications. Such antenna matching units include isolating circuits of high quality in which high idle powers occur. For this reason, in such matching units to switchover the reactances used here, the switches used must be able to switch relatively high powers. Switches, such as vacuum relays, used for relatively high power loads have relatively slow switching times. The more modern rapidly switching semiconductor switches cannot be used in these transmitters because of the high-power load requirements. The rapidity of the frequency switchover is therefore determined in these units exclusively by the rapidity at which the matching unit can be switched in frequency. In actual practice, at best switchover times of a few milliseconds can be attained. This is too slow for various applications, including those mentioned above, as well as many military applications.

SUMMARY OF THE INVENTION

The present invention provides an antenna matching apparatus for a high-frequency transmitter rapidly switchable to different transmitting frequencies. The antenna may be thus tuned in frequency exactly as quickly as the transmitter.

According to the present invention, a plurality of antenna tuning means are used. Connected between the trasmitter and these antenna tuning means are rapid switches. During the transmission of signals through one of the antenna tuning means to the antenna it is possible to tune another antenna tuning means to the subsequent frequency in the frequency scheme. Where more than two antenna tuning means are used, several of the antenna tuning means can be tuned in the sequence of frequencies according to the frequency scheme. This enables the frequency switchover to be accomplished by the rapid switches connected to the already tuned antenna tuning means.

The switches used for switching between different units can be the exact same semiconductor switches used in the transmitter itself. Although the same slow switches are used by the individual tuning means to provide their tuning, with the arrangement of the present invention, it is possible to switch very rapidly from one transmitting frequency to the next. It is thereby possible to switch the antenna matching apparatus exactly as rapidly as modern transmitters, in the millisecond or microsecond range.

In general, it is sufficient to use the rapid switches only on the input side to the antenna tuning means. The outputs of the antenna tuning means can be connected directly with the antenna. However, if needed to avoid certain feedback or influences from power surges of the individual antenna tuning means on the output side, it can be advantageous to provide a second set of rapid switches on the output side as well. The switches on the output side would be set so that only the tuning unit which is being used at the time would be connected with the antenna.

DETAILED DESCRIPTION OF THE PREFERRED EMBODIMENTS

Figure 1:
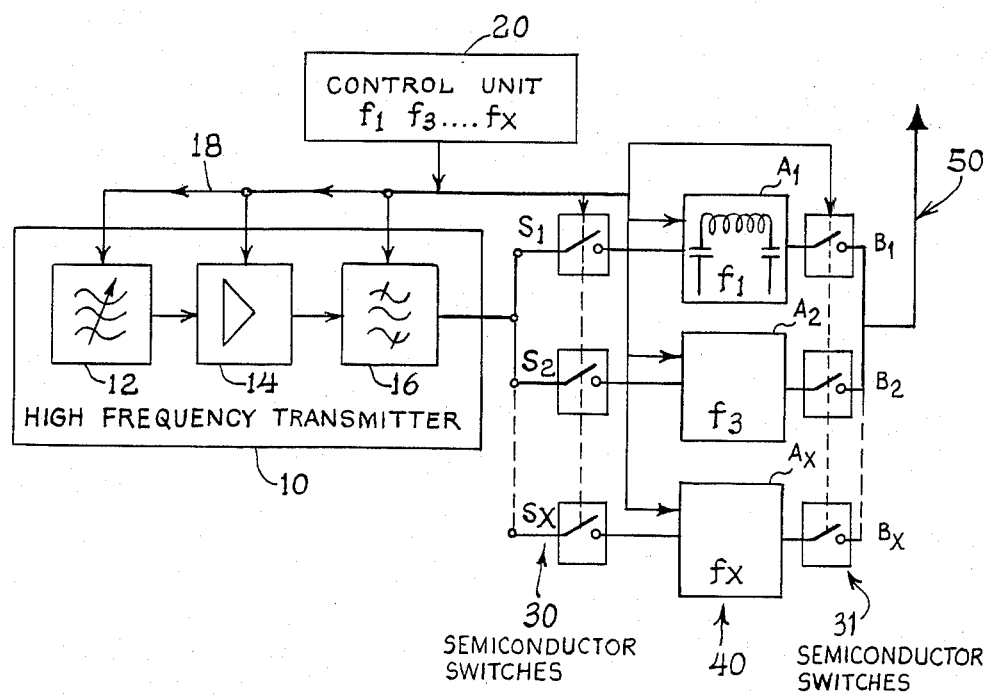
FIG. 1 is a schematic diagram of the antenna matching apparatus of the present invention.

Referring now to FIG. 1, a typical high frequency transmitter 10 is shown. A typical frequency for the transmitter 10 would be between 20 and 80 megahertz. The transmitter 10 consists of a tunable oscillator 12, a power amplifier 14 and a tunable filter 16. The tunable filter 16 connects to the outlet side of the transmitter 10. The transmitter 10 is a device rapidly switchable in frequency. Such devices are known as frequency hopping transmitters. Hazeltine and ITT/SEL are two manufacturers of frequency hopping transmitters which can be used in conjunction with the antenna matching apparatus.

The transmitter 10 is tunable by a control unit 20 through a control line 18. A predetermined frequency sequence or scheme is programmed into the control unit 20. This frequency scheme must be the same as that known by the apparatus receiving the transmissions. In the example shown in FIG. 1, the transmitter 10 is being switched very rapidly through the frequency sequence $f_1, f_3, f_7 \ldots f_X$. This is the predetermined sequence of transmitting frequencies within the selected frequency band.

The output of the transmitter 10 is connected over very rapid switches 30 ($S_1, S_2, S_X$) to individual antenna tuning units 40 ($A_1, A_2, A_X$). The antenna tuning units 40 are connected at their output side to the antenna 50. If necessary, there can also be added between the antenna 50 and the antenna tuning units 40 a second set of rapid switches 31($B_1, B_2, B_X$) to be switched synchronously with the input side switches.

The switches 30, 31 are preferably semiconductor switches that are switchable within the microsecond range. The antenna tuning units 40 are constructed in the usual manner. For example, it is possible to use the Rohde & Schwarz Antenna Tuning Unit Model HS9123/1 for each of the antenna tuning units 40. The reactances of the antenna tuning units are tunable through relatively slow power switches, for example, reed relays. Control unit 20 controls the antenna tuning units 40, tuning them to the transmitting frequencies within the frequency scheme. The frequency scheme stored in the control unit 20 is fixed. It must after all be the same scheme known also on the reception side.

The antenna matching apparatus operates as follows. The first antenna tuning unit $A_1$ which is controlled by the control unit 20 is tuned to the frequency $f_1$, exactly as the transmitter 10. Switches $S_1$ and $B_1$ are closed. Therefore, the transmitter 10 transmits through the antenna tuning unit $A_1$ and the antenna 50. During this transmission time the second antenna tuning unit $A_2$ is tuned to the frequency $f_3$ the next frequency in the predetermined scheme. When the control unit 20 switches the transmitter 10 to the next transmitting frequency $f_3$, simultaneously $S_1$ and $B_1$ are opened and $S_2$ and $B_2$ are closed. Thereby antenna tuning unit $A_2$ which has been previously tuned to the frequency $f_3$ is switched through to the antenna 50. Even with only two antenna tuning units, the matching apparatus can switch rapidly in frequency. The tuning units have a greater time to switch frequencies. They have available the time it takes for tuning the transmitter and the time used to send out information over a prescribed frequency. If this time is not sufficient for tuning the antenna tuning unit, then it is advisable to provide more than two tuning units and to tune these to the subsequent different frequencies in the frequency scheme. By using more antenna tuning units the switching time of the antenna matching apparatus is correspondingly shortened.

In the extreme case, it is even possible to provide exactly as many antenna tuning units 40 as there are different frequencies ($f_1$ to $f_x$) to be transmitted. For example, there may be 10 to 20 different transmitting frequencies and also the same number of tuning units. Thus, extremely short tuning times are attainable. In this last case, tuning of all the units can be performed all at once at the beginning of the transmission. It is only then necessary to take care that these tunings are retained. To perform the frequency changes, only the rapid switches 30, 31 connected between the transmitter 10 and the tuning units 40 need to be actuated. This method enables switchover times in the microsecond range.

Of course, it should be understood that various changes and modifications to the preferred embodiments described above will be apparent to those skilled in the art. For example, any equivalent antenna tuning means can be used in place of the antenna tuning unit described above. This and other changes can be made without departing from the spirit and the scope of the invention and without diminishing its attendant advantages. It is therefore intended that such changes and modifications be covered by the following claims.

We claim:

1. An apparatus for matching the impedance of an antenna with the output impedance of a transmitter which generates an output signal having a frequency that varies according to a predetermined frequency scheme, comprising:

a plurality of antenna tuning means, each being automatically tunable to a plurality of frequencies and each having an input for receiving the output signal from the transmitter and an output for coupling to the antenna, the number of said antenna tuning means being less than the number of different frequencies in said predetermined frequency scheme;

first switching means for selectively providing an automatically controllable connection between the transmitter and any selected one of the inputs of said antenna tuning means; and control means for automatically controlling said first switching means and for automatically tuning said antenna tuning means so that, for each of the frequencies in the predetermined frequency scheme, a selected one of said antenna tuning means is automatically tuned to match the impedance of the antenna with the output impedance of the transmitter, and the input of said selected antenna tuning means is automatically connected to the transmitter;

said control means repeatedly retuning at least one of the tuning means such that said at least one of the tuning means is automatically successively tuned to multiple ones of the frequencies in the predetermined frequency scheme during the transmission of signals from the transmitter to the antenna.

2. The antenna matching apparatus of claim 1 wherein said control means automatically retunes said at least one of the tuning means during a time period when another of the tuning means is connected between the transmitter and the antenna by the first switching means, in order to reduce interruptions in the transmission of signals from the transmitter to the antenna during retuning of said at least one of the tuning means.

3. The antenna matching apparatus of claim 1 wherein each of said first switching means comprises a respective semiconductor switch.

4. The antenna matching apparatus of claim 3 further comprising:

second switching means, for selectively providing an automatically controllable connection between the antenna and any selected one of said outputs of said antenna tuning means, and wherein said control means further includes means for automatically controlling said second switching means to connect the output of said selected antenna tuning means to the antenna.

* * * * *